United States Patent [19]

Malhi

[11] Patent Number: 4,502,202
[45] Date of Patent: Mar. 5, 1985

[54] METHOD FOR FABRICATING OVERLAID DEVICE IN STACKED CMOS

[75] Inventor: Satwinder Malhi, Richardson, Tex.

[73] Assignee: Texas Instruments Incorporated, Dallas, Tex.

[21] Appl. No.: 505,155

[22] Filed: Jun. 17, 1983

[51] Int. Cl.[3] .................. H01L 21/265; H01L 29/98; H01L 21/00
[52] U.S. Cl. ........................................ 29/571; 357/23.9
[58] Field of Search ..................................... 29/571

[56] References Cited

U.S. PATENT DOCUMENTS

| 4,406,710 | 9/1983 | Davies et al. | 29/571 |
| 4,420,344 | 12/1983 | Davies et al. | 29/571 |
| 4,434,013 | 2/1984 | Bol | 29/571 |

FOREIGN PATENT DOCUMENTS

| 0085168 | 10/1983 | European Pat. Off. | 29/571 |
| WO83/01538 | 10/1982 | PCT Int'l Appl. | 29/571 |

OTHER PUBLICATIONS

A. L. Robinson et al., IEDM, 83, 530–533, 1983.
J. F. Gibbons, IEEE Electron Device Letters, vol. EDL-1, No. 6, pp. 117–118, Jun. 1980.
Jean-Pierre Colinge et al., J. Solid State Circuits, vol. SC-17, No. 2, pp. 215–219, Apr., 1982.
C. E. Chen et al., IEEE Electron Device Letters, vol. EDL-4, No. 8, pp. 272–274, Aug. 1983.
Allied Chemical, Electronic Chem. Prod. Pre. Data Sheet Experimental Boron Spin-on Dopant for Semiconductor Proc, X13150, pp. 1–4.

*Primary Examiner*—Veronica O'Keefe
*Attorney, Agent, or Firm*—Robert Groover, III; James T. Comfort; Melvin Sharp

[57] ABSTRACT

In stacked CMOS, a single gate in first level polysilicon is used to address both an n-channel device in the substrate and an overlaid p-channel device. The p-channel polysilicon device has its channel self-aligned to the gate, by the use of a boron-doped oxide at the sidewalls of the gate. This boron-doped oxide provides a dopant source which dopes the second polysilicon layer to provide heavily doped source/drain extension regions which are self-aligned to the gate in first poly. A mask level is still required to pattern the sources and drains, but the self-aligned source/drain extension regions mean that the source/drain mask level can have a reasonable alignment tolerance.

5 Claims, 5 Drawing Figures

METHOD FOR FABRICATING OVERLAID DEVICE IN STACKED CMOS

BACKGROUND AND SUMMARY OF THE INVENTION

The present invention relates to CMOS integrated circuits, i.e. to integrated circuits containing both n-channel and p-channel insulated gate field effect devices.

It is widely recognized in the art that it would be highly desirable to achieve practical stacked CMOS integrated circuits, i.e. circuits where a single gate at a single location is capacitatively coupled to control both n-channel and p-channel devices. It is usually assumed that the n-channel devices would be formed in the substrate and the p-channel devices would be formed in polysilicon, although this is not strictly necessary.

Stacked CMOS has the potential to provide extremely dense integrated circuits, and especially to provide extremely dense memory circuits. However, known methods for fabrication of stacked CMOS structures do not permit the overlaid device to be self-aligned. That is, the mask which is used to pattern the channel region of the overlayed polysilicon is applied in a separate masking step from the patterning of the gate which must address this channel. This means that small geometry devices become infeasible, since misalignment between the gate and channel region would introduce a disastrous spread in device characteristics.

Thus it is an object of the present invention to provide a stacked CMOS integrated circuit structure wherein an overlaid polysilicon device has a channel region which is self-aligned to a gate electrode beneath the channel region.

A further difficulty in prior consideration of stacked CMOS devices has been the very low quality of polysilicon-channel devices which have heretofore been attainable. In particular, it is highly desirable to provide a processing technology which provides relatively good device quality in the polysilicon overlaid device.

Thus it is an object of the present invention to provide a stacked CMOS integrated circuit structure which has good device characteristics in the overlaid polysilicon device.

The present invention uses doped oxide sidewall filaments to the first level gate electrode, so that these doped sidewall filaments provide self-aligned doping of the thin second poly level which is used for the overlaid device. Thus, when a separate masking level is used to define the sources and drains of the overlaid device, the masked source/drain regions are connected by source/drain extension regions (doped by diffusion from the doped sidewall oxide) to a lightly doped polysilicon channel region which is self-aligned to the first level gate.

According to the present invention there is provided:
1. A stacked CMOS device comprising:
   a substrate;
   first and second source/drain regions having a first conductivity type within the surface of said substrate, said source/drain regions defining a channel region therebetween;
   an insulated gate level atop said channel region, said insulated gate having approximately vertical sidewalls;
   filaments adjacent to said sidewalls of said gate, said filaments of second-dopant;
   a second gate insulator atop said gate level;
   a thin polysilicon layer atop said second gate insulator and said sidewall filaments, said thin polysilicon layer comprising a second-conductivity type dopant, said thin polysilicon layer being more lightly doped atop said gate level than elsewhere.

BRIEF DESCRIPTION OF THE DRAWING

The present invention will be discussed with reference to the accompanying drawings, wherein.

DESCRIPTION OF THE PREFERRED EMBODIMENTS

Figure 1:
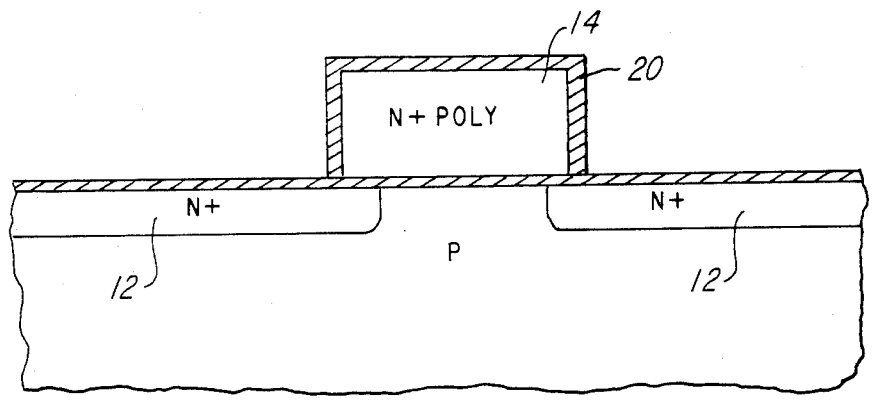
FIGS. 1-4 show successive stages in fabrication of the device of the present invention.
Figure 2:
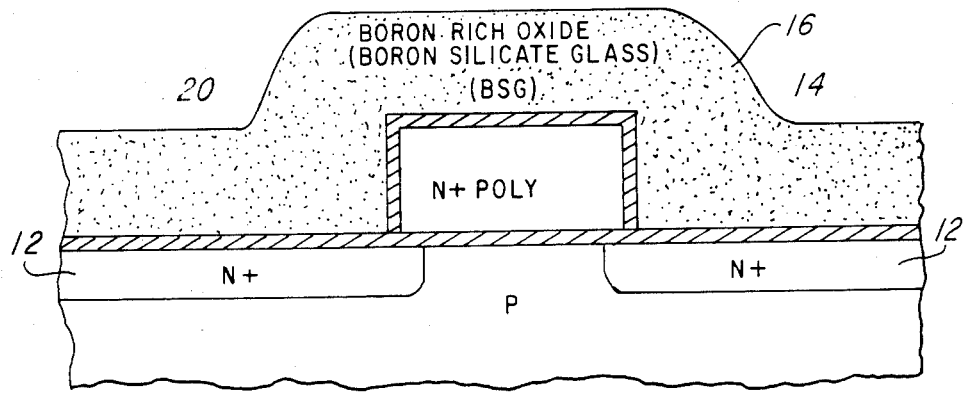

FIG. 1 shows a first stage in the fabrication of the device according to the present invention. Fabrication up to this point is entirely conventional. That is, a moat is patterned, a channel stop implant applied, thick field oxide grown, the nitride moat mask is removed, the moat surface is stripped and a gate oxide is grown, and a first polysilicon level is deposited, doped and patterned. The etching of the first polysilicon level should produce approximately vertical sidewalls, but this is normally achieved by a conventional polysilicon plasma etching methods anyway. In the presently preferred embodiment, the first polysilicon level is about 500 angstroms thick and is $POCl_3$ doped to a sheet resistance of 30 per square. Sources and drains 12 are then implanted, e.g. using 1E16 per centimeter squared of arsenic at 50 kev, and this implant is then driven in. An encapsulating oxide is now grown on the first poly level 14 and on the substrate. The encapsulating oxide is preferably grown to a thickness of 500 to 1000 angstroms over the polysilicon first gate level 14. This oxide thickness corresponds to growth conditions of roughly 20 minutes at 1000° C. in dry oxygen.

At this point a boron rich oxide is either deposited or spun on. Preferable a boro-silicate glass is used, as is conventionally used for a base diffusion in bipolar technology. In the presently preferred embodiment, where the n plus polysilicon gate 14 is one micron wide, the boro-silicate glass 16 is spun onto a thickness of at least 5000 A. This glass is then etched to one hundred percent of its thickness, so that only the sidewall filaments 18 remain of the boro-silicate glass. The etching step which removes the boro-silicate glass will also typically strip the incapsulating oxide 20 from the top of the gate level 14, so that a second gate oxide is now grown. This second gate oxide is relatively thin, e.g. 300 angstroms. This second gate oxide 22 will be the gate oxide for the overlaid p-channel transistors. Now a thin layer of polysilicon is deposited, to form the overlaid transistor.

In the presently preferred embodiment, the second polysilicon layer is less than 2000 angstroms thick, and is doped to a bulk dopant concentration of at least $10^{17}$ per cubic centemeter. In the presently preferred embodiment, 1500 angstroms of polysilicon is deposited by low pressure CVD, and doped p-type in the range of $10^{17}$ to $10^{18}$ per cc to adjust the threshold voltage of the p-channel device as desired. (However, it should be noted that the doping of the polysilicon channel region 24 could be as high as $10^{19}$ per cubic centimeter, although this is definitely not preferred, or could be lower than $10^{17}$, down to $10^{16}$ per cc. Excessively low dopings will tend to produce high threshold. Excessively high channel dopings will tend to produce soft turn off characteristics as will application of a polysilicon layer thicker than 2000 angstroms.

An annealing step is now applied, so that boron diffuses from the sidewall filaments 18 into the second polysilicon layer to form P plus source/drain extension regions 26. In the presently preferred embodiment, very heavily doped boro-silicate glass is used, and the anneal is, e.g., 15 min at 900 C. Since the boron rich sidewall oxide filaments 18 are self-aligned to the gate 14, the source/drain extension regions 26 are also self-aligned to the gate 14, and this means that the channel region 24 is self-aligned to the gate 14. Note that the boron will typically diffuse laterally slightly into the channel region 24, but this encroachment can be kept small. That is, it is only necessary that the boron saturate the thickness of the poly to form the extension region 26, so that the annealing conditions can be controlled to keep the diffusion length of the boron in the polysilicon relatively short.

Figure 3:
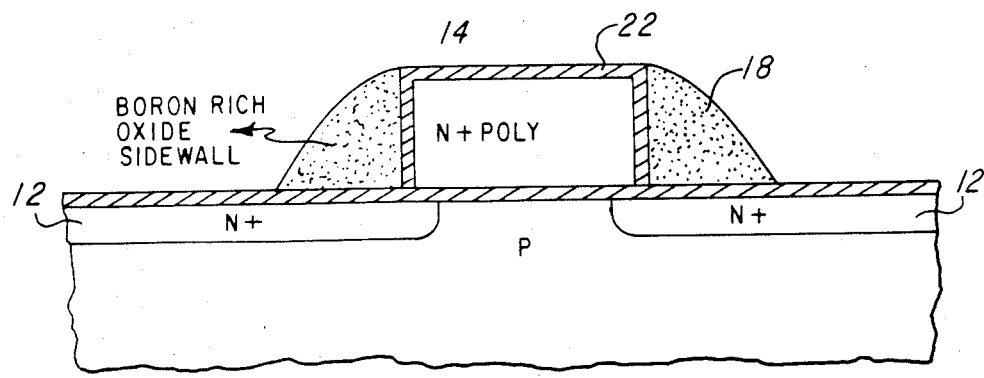

In addition, it should be noted that, in FIG. 3, the sidewall oxide filaments 18 are shown at a condition of exactly 100 percent etch. That is, the top of the filament 18 is shown exactly lined up with the n plus poly gate 14. However, in practice, it is much more reproducible to use a slight overetch, e.g. 110 percent or 120 percent etch, in which case the filaments 18 will be slightly lower than the top of the first poly gate 14. This means that the channel region 24 will be curved around the corner of the n plus poly gate 14. This slight additional length in a channel 24 will reduce the encroachment caused by lateral diffusion of dopants into the channel region 24, and retain a reasonably large effective channel length.

Figure 4:
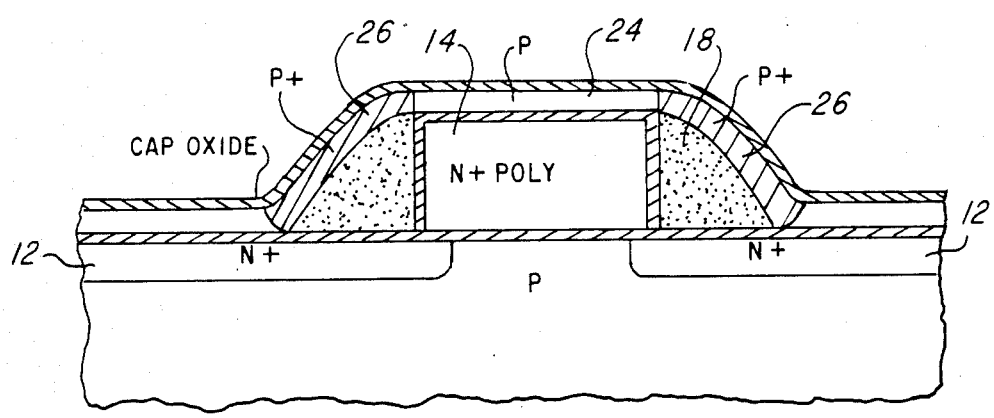

A thin cap oxide, e.g. 300 angstroms, is now preferably grown over the thin polysilicon layer. This produces the structure shown in FIG. 4.

Figure 5:
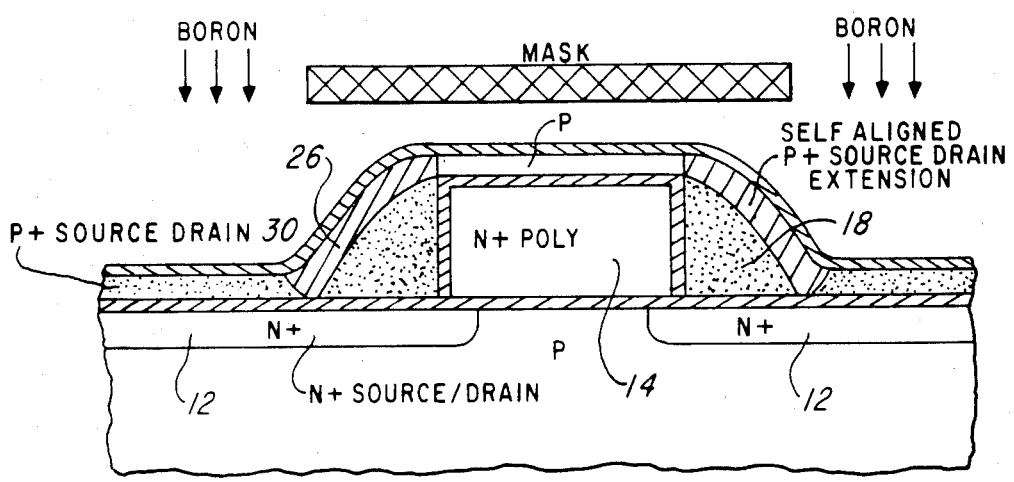
FIG. 5 shows the last stage of fabrication, and a completed stacked CMOS device according to the present invention.

The source/drain extension regions 26 have now been formed, so that alignment tolerance is permissible in patterning the remainder of the source/drains. That is, as shown in FIG. 5, an oversized mask is used to pattern the p-channel source/drains. Ths mask must have a width of at least a plus 2b, where a is the width of the n plus poly gate 14 and b is the alignment tolerance between this mask level and the mask level which was used to pattern the poly gate 14. As shown in FIG. 5, the boron implant which is now applied is guaranteed to contact the source/drain extension regions 26, and therefore provide an operative p-channel transistor, which has p plus source drain regions 30 connected through source/drain extension regions 26 to a p-type channel region 24.

The source/drain implant preferably comprises 1E15 per square centimeter of boron difluoride at an energy of 90 kev.

After this implant is driven in, hydrogen annealing is preferably applied. This will greatly improve the characteristics of the p-type channel regions 24 in the polysilicon transistors. Hydrogen annealing can be applied, e.g. by exposing the entire device to a plasma discharge in hydrogen for 60 minutes at 300 degrees C. at one Torr, so that hydrogen ions diffuse to passivate traps at grain boundary sites within the p-channel region 24. This hydrogen passivation increases the effective mobility in the polysilicon channel region substantially, and therefore lowers the series resistance of the device. It also reduces leakage current through the device.

Subsequent to this hydrogen annealing step, it is preferable to avoid any extended high-temperature steps. That is, if the device is subsequently held at high-temperature, the atomic hydrogen which was trapped in the drain boundaries will gradually recombine and out-diffuse as molecular hydrogen. However, this process is gradual and not catastrophic, so that modest time periods at moderately elevated temperatures are no problem. For example, one hour at 450 degrees C. can be tolerated. However, it is preferable to perform reflow of multilevel oxide using transient heating, e.g. with a $CO_2$ laser, and/or to use low-temperature materials, e.g., boro-phospho-silicate glass, lead-doped glass, or organic insulators such as PIQ or polyimide, for the MLO.

In the presently preferred embodiment, the multilevel oxide is provided by OCD, which is spun-on and then baked at low temperture to remove the organic solvent.

It is also preferable to reduce the high-temperature time used for contact sintering. In the presently preferred embodiment, contact sintering (with one percent silicon-doped aluminum) is 10 minutes at 400 C. in a hydrogen atmosphere.

Of course, the second poly level is patterned before the multilevel oxide is applied, but it is unimportant whether this is performed before or after the source/drain implant is applied. Preferably the source/drain implant is applied before the second poly level is patterned, to avoid inadvertent introduction of p-type impurities into undesired areas of the substrate.

All subsequent steps of processing are entirely conventonal, except for the moderately preferable safeguard, discussed above, of restricting the amount of time which is spent at high temperatures. That is, processing continues with contact patterning, metallization deposition and patterning, protective overcoat deposition and patterning, etc., as well known to those skilled in the art.

As will be obvious to those skilled to the art, the present invention provides a fundamental new device structure, which can be used in a tremendous variety of integrated circuit configurations. The scope of the present invention is not limited except as specified in the accompanying claims.

Additional information regarding the thin polysilicon overlaid device is found in simultaneously-filed U.S. Application Ser. No. 505,156, which is hereby incorporated by reference.

What is claimed is:

1. A method for fabricating a stacked CMOS device, comprising the steps of;
   providing a substrate;
   growing a gate oxide on said substrate;
   forming a gate electrode in desired gate locations, said gate electrode being formed to have substantially vertically sidewalls in desired gate locations;
   depositing and anistropically etching a dopant source material, to provide sidewall filaments of said dopant source adjacent to said sidewalls of said gate electrode;
   depositing a thin polysilicon layer over all, said thin polysilicon layer being insulated from said gate electrode and comprising a second-type dopant;
   providing a mask over said gate electrode, said mask being wider than the width of said gate electrode, and implanting a heavy concentration of a second-conductivity type dopant into said thin polysilicon layer;

whereby said gate electrode addresses both a field effect transistor having first-type sources and drains in said substrate, and a field effect transistor having second-type sources and drains and a polysilicon channel.

2. The method of claim 1, further comprising the subsequent step of:

introducing a passivating species into said thin polysilicon layer, to improve the effective mobility of carriers in said thin polysilicon layer.

3. The method of claim 2, wherein said passivation step comprises exposure to a hydrogen plasma.

4. The method of claim 10, further comprising the step of:

patterning said thin polysilicon layer to achieve a desired device configuration.

5. The method of claim 1, further comprising the subsequent step of:

interconnecting predetermined ones of said first-conductivity-type and said second conductivity-type transistors to achieve a desired circuit function.

* * * * *